(12) United States Patent
Kuo

(10) Patent No.: US 10,523,243 B2
(45) Date of Patent: Dec. 31, 2019

(54) ENCODER, ASSOCIATED ENCODING METHOD, AND FLASH MEMORY CONTROLLER UTILIZING DIVIDED PARTIAL PARITY BLOCKS FOR CIRCULANT CONVOLUTION CALCULATIONS

(71) Applicant: Silicon Motion Inc., Hsinchu County (TW)

(72) Inventor: Shiuan-Hao Kuo, New Taipei (TW)

(73) Assignee: Silicon Motion, Inc., Hsinchu County (TW)

( * ) Notice: Subject to any disclaimer, the term of this patent is extended or adjusted under 35 U.S.C. 154(b) by 0 days.

(21) Appl. No.: 16/038,147

(22) Filed: Jul. 17, 2018

(65) Prior Publication Data

US 2019/0165817 A1 May 30, 2019

(30) Foreign Application Priority Data

Nov. 27, 2017 (TW) .............................. 106141115 A

(51) Int. Cl.
| | | |
|---|---|---|
| *H03M 13/29* | (2006.01) | |
| *H03M 13/00* | (2006.01) | |
| *G06F 11/10* | (2006.01) | |
| *G06F 11/00* | (2006.01) | |
| *H03M 13/11* | (2006.01) | |

(52) U.S. Cl.
CPC ..... *H03M 13/2933* (2013.01); *G06F 11/1076* (2013.01); *H03M 13/116* (2013.01); *H03M 13/2906* (2013.01); *H03M 13/611* (2013.01)

(58) Field of Classification Search
None
See application file for complete search history.

(56) References Cited

U.S. PATENT DOCUMENTS

| | | | |
|---|---|---|---|
| 6,732,322 B1 | 5/2004 | Miyauchi | |
| 8,175,012 B2 | 5/2012 | Chu | |
| 9,166,622 B2* | 10/2015 | Yang | .................... G06F 11/1008 |
| 2004/0213354 A1* | 10/2004 | Jones | ....................... H04B 3/32 |
| | | | 375/285 |
| 2008/0168337 A1 | 7/2008 | Gaal | |

(Continued)

FOREIGN PATENT DOCUMENTS

| | | |
|---|---|---|
| CN | 1256005 A | 6/2000 |
| CN | 104464822 A | 3/2015 |
| CN | 106158020 A | 11/2016 |

*Primary Examiner* — Justin R Knapp
(74) *Attorney, Agent, or Firm* — Winston Hsu

(57) ABSTRACT

An encoding method includes: processing a plurality of data blocks to generate a plurality of partial parity blocks, wherein the partial parity blocks includes a first portion and a second portion; using a first computing circuit to generate a first calculating result according to the second portion of the partial parity blocks; using the first calculating result to adjust the first portion of the partial parity blocks; performing circulant convolution operations upon the adjusted first portion to generate a first portion of parity blocks; and using a second computing circuit to generate a second portion of the parity blocks according to at least the first portion of parity blocks; wherein the first portion of the parity blocks and the second portion of the parity blocks serve as a plurality of parity blocks generated in response to encoding the data blocks.

21 Claims, 6 Drawing Sheets

(56) References Cited

U.S. PATENT DOCUMENTS

| | | |
|---|---|---|
| 2010/0253555 A1 | 10/2010 | Weingarten |
| 2014/0095960 A1 | 4/2014 | Chu |
| 2014/0136921 A1* | 5/2014 | Murakami ......... H03M 13/1154 714/758 |
| 2015/0229331 A1* | 8/2015 | Panteleev .......... H03M 13/1171 360/53 |
| 2016/0283319 A1 | 9/2016 | Chou |
| 2017/0324430 A1* | 11/2017 | Han ................. H03M 13/3746 |

* cited by examiner

ENCODER, ASSOCIATED ENCODING METHOD, AND FLASH MEMORY CONTROLLER UTILIZING DIVIDED PARTIAL PARITY BLOCKS FOR CIRCULANT CONVOLUTION CALCULATIONS

BACKGROUND OF THE INVENTION

1. Field of the Invention

The present invention relates to an encoder, and more particularly, to an encoder applied in a flash memory controller.

2. Description of the Prior Art

Inside an encoder, a parity-check matrix enables the encoder to check whether a generated parity-check code is correct. After the encoder encodes data in order to generate a parity-check code, the encoder will multiply the data with the parity-check matrix. If the multiplication result is equal to "0", the coding is determined to be correct; if the multiplication result does not equal to "0", the coding is determined as incorrect. The encoder may comprise a corresponding parity-check generation matrix in order to generate a suitable parity-check code. Under some circumstances, the parity-check generation matrix might not be found, however, meaning the encoder will need to perform a plurality of matrix multiplication operations and/or compensation/adjustment operations, in order to generate a parity-check code similar to that generated by a parity-check generation matrix. The complexity of the encoder will therefore be increased. In particular, the above-mentioned matrix multiplication operations usually involve circulant convolution calculations, which further increase the hardware cost of the encoder.

SUMMARY OF THE INVENTION

An objective of the present invention is to provide an encoder, which can reduce the hardware required for circulant convolution calculations in the encoder, in order to prevent increased hardware costs encountered in related art techniques.

An aspect of the present invention provides an encoder installed in a flash memory controller. The encoder comprises a first barrel shifter module, a first computing circuit, an adjusting circuit, a first circulant convolution computing circuit, and a second computing circuit. The first barrel shifter module is arranged to process a plurality of data blocks to generate a plurality of partial parity blocks, wherein the partial parity blocks comprise a first portion and a second portion. The first computing circuit is coupled to the first barrel shifter module, and is arranged to generate a first calculating result according to the second portion. The adjusting circuit is arranged to adjust the first portion according to the first calculating result, in order to generate an adjusted first portion. The first circulant convolution computing circuit is coupled to the adjusting circuit, and is arranged to perform circulant convolution operations upon the adjusted first portion, in order to generate a first portion of parity blocks. The second computing circuit is coupled to the first circulant convolution computing circuit, and is arranged to generate a second portion of parity blocks at least according to the first portion of parity blocks. The first portion of parity blocks and the second portion of parity blocks serve as a plurality of parity blocks generated for the data blocks by the encoder, and the data blocks and the parity blocks are written into a flash memory.

Another aspect of the present invention provides a flash memory controller, which is arranged to access a flash memory module. The flash memory controller comprises a memory, a microprocessor and an encoder. The memory is arranged to store a code. The microprocessor is arranged to execute the code in order to control access of the flash memory module. The encoder is arranged to encode the data blocks in order to obtain a plurality of parity blocks, and comprises a first barrel shifter module, a first computing circuit, an adjusting circuit, a first circulant convolution computing circuit, and a second computing circuit. The first barrel shifter module is arranged to perform operations upon a plurality of data blocks in order to generate a plurality of partial parity blocks, wherein the partial parity blocks comprise a first portion and a second portion. The first computing circuit is coupled to the first barrel shifter module, and arranged to generate a first calculating result according to the second portion. The adjusting circuit is arranged to adjust the first portion of the partial parity blocks according to the first calculating result, in order to generate an adjusted first portion. The first circulant convolution computing circuit is coupled to the adjusting circuit, and is arranged to perform circulant convolution operations upon the adjusted first portion, in order to generate a first portion of parity blocks. The second computing circuit is coupled to the first circulant convolution computing circuit, and is arranged to generate a second portion of parity blocks at least according to the first portion of parity blocks. The first portion of parity blocks and the second portion of parity blocks serve as a plurality of parity blocks generated for the data blocks by the encoder.

Yet another aspect of the present invention provides an encoding method for a flash memory controller. The method comprises: processing a plurality of data blocks to generate a plurality of partial parity blocks, wherein the partial parity blocks comprise a first portion and a second portion; using a first computing circuit to generate a first calculating result according to the second portion; adjusting the first portion of the partial parity blocks according to the first calculating result, in order to generate an adjusted first portion; performing circulant convolution operations upon the adjusted first portion, in order to generate a first portion of parity blocks; and using a second computing circuit to generate a second portion of the parity blocks according to at least the first portion of parity blocks. The first portion of the parity blocks and the second portion of the parity blocks serve as a plurality of parity blocks generated in response to encoding of the data blocks, and the data blocks and the parity blocks are written into a flash memory.

Still another aspect of the present invention provides an encoder installed in a flash memory controller. The encoder comprises a barrel shifter module, an adjusting circuit, a circulant convolution computing circuit, and a computing circuit. The barrel shifter module is arranged to perform operations upon a plurality of data blocks in order to generate a plurality of partial parity blocks, wherein the partial parity blocks comprise a first portion and a second portion. The adjusting circuit is arranged to adjust the first portion of the partial parity blocks according to the second portion, in order to generate an adjusted first portion. The circulant convolution computing circuit is coupled to the adjusting circuit, and is arranged to perform circulant convolution operations on the adjusted first portion in order to generate a first portion of parity blocks. The computing circuit is coupled to the circulant convolution computing circuit, and is arranged to generate a second portion of parity blocks at least according to the first portion of parity blocks. The first portion of parity blocks and the second portion of parity blocks serve as a plurality of parity blocks generated for the data blocks by the encoder, and the data blocks and the parity blocks are written into a flash memory.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
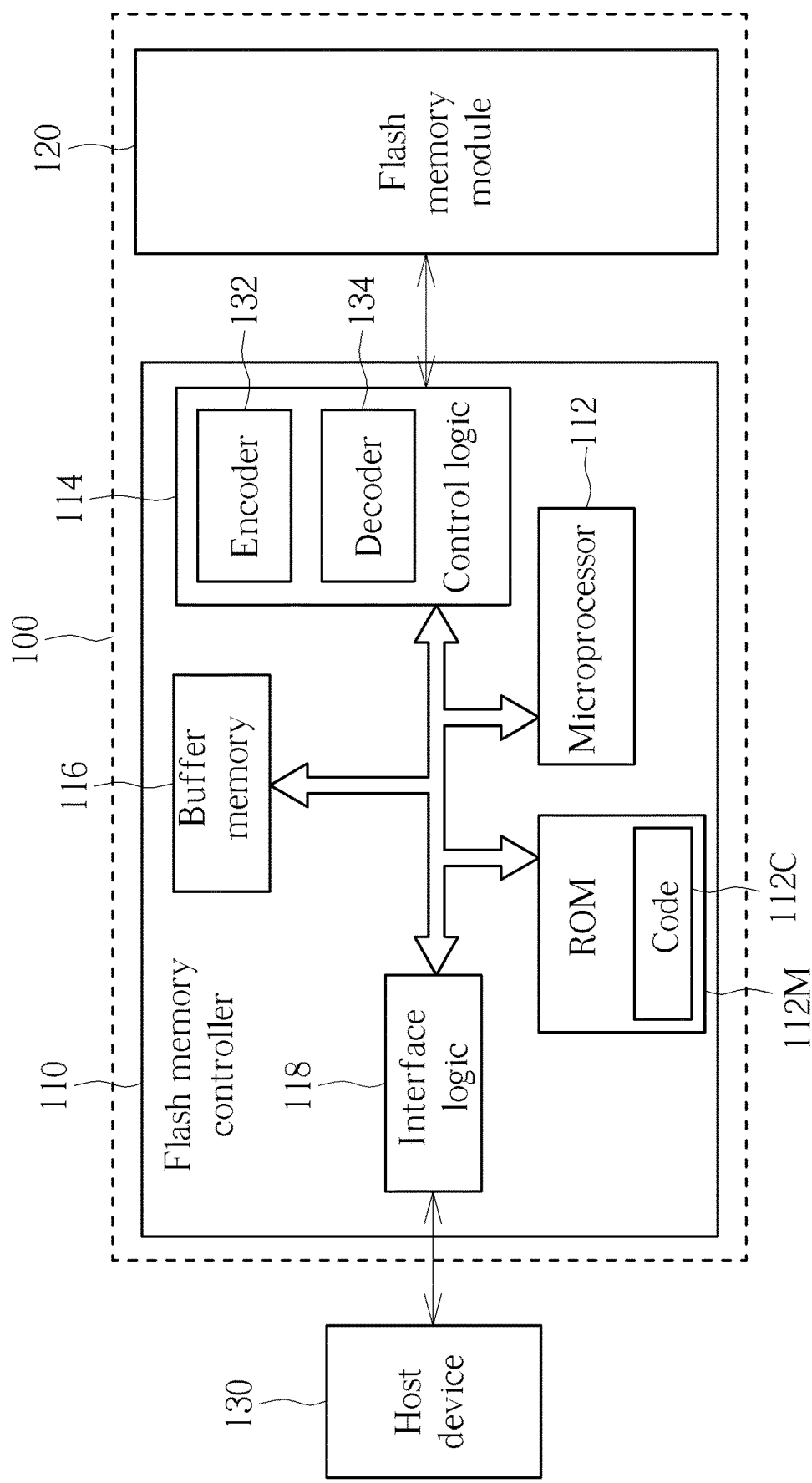
FIG. 1 is a diagram illustrating a memory device according to an embodiment of the present invention.

Refer to FIG. 1, which is a diagram illustrating a memory device 100 according to an embodiment of the present invention. The memory device 100 comprises a flash memory module 120 and a flash memory controller 110, and the flash memory controller 110 is arranged to access the flash memory module 120. According to this embodiment, the flash memory controller 110 comprises a microprocessor 112, a read only memory (ROM) 112M, a control logic 114, a buffer memory 116, and an interface logic 118. The ROM 112M is arranged to store a code 112C, and the microprocessor 112 is used to execute the code 112C in order to control access of the flash memory module 120. The control logic 114 comprises an encoder 132 and a decoder 134, wherein the encoder 132 is arranged to encode the data written into the flash memory module 120 in order to generate a corresponding parity-check code (also called an error correction code (ECC)), and the decoder 134 is arranged to decode the data read from the flash memory module 120.

The flash memory module 120 may comprise a plurality of flash memory chips, and each flash memory chip may comprise a plurality of blocks. The controller (e.g. the flash memory controller 110 that utilizes the microprocessor 112 to execute the code 112C) may use a "block" as the unit when performing operations upon the flash memory module 120, such as copying, erasing, data-combining. Further, a block may record a certain amount of pages, and the controller (e.g. the flash memory controller 110 that utilizes the microprocessor 112 to execute the code 112C) may use a "page" as the unit when writing data into the flash memory module 120.

In practice, the flash memory controller 110 that utilizes the microprocessor 112 to execute the code 112C may utilize its inner elements to perform various control operations, such as: utilizing the control logic 114 to control the access of the flash memory module 120 (especially to control access of at least one block or at least one page), utilizing the buffer memory 116 to perform necessary buffering processes, and utilizing the interface logic 118 to communicate with a host device 130.

In one embodiment, the memory device 100 may be a portable memory device (e.g. a memory card conforming to SD/MMC, CF, MS, XD specifications), and the host device 130 may be an electronic device connectable with the memory device, such as a cellphone, laptop computer, desktop computer, etc. In another embodiment, the memory device 100 can be installed within an electronic device (e.g. a cellphone, laptop computer, desktop computer, etc.), while the host device 130 may be a processor of the electronic device.

In this embodiment, the encoder 132 is a low-density parity check (LDPC) code) encoder, which may generate a corresponding parity-check code according to the data from the host device 130, wherein the generated parity-check code conforms to a parity-check matrix. More specifically, referring to FIG. 2 which is a diagram illustrating a parity-check matrix and a parity-check generation matrix, assuming the size of the parity-check matrix is equal to c*t (e.g. c=5, t=48), the parity-check matrix may be divided into a left-hand side matrix M (with the size c*(t-c)) and a right-hand side matrix K (with the size c*c). In order to find a parity-check generation matrix corresponding to the parity-check matrix, the inverse matrix $K^{-1}$ of the matrix K will be required in advance, which is then multiplied with the matrix M to obtain the matrix P. The transpose matrix of the matrix P may serve as the parity-check generation matrix. In other words, after the transpose matrix of the matrix P is obtained, the encoder 132 may multiply the data of the host device 130 with the transpose matrix of the matrix P to obtain the parity-check code corresponding to the data, and then the encoder multiplies the data and the parity-check code with the parity-check matrix in order to determine whether the parity-check code is correct or not. For example, if the multiplication result is equal to "0", the coding will be determined as correct; and if the multiplication result is not equal to "0", the coding will be determined as incorrect. After the coding is determined as correct, the data and the corresponding parity-check code will be written into a page in the flash memory module 120.

In some circumstances, the inverse matrix $K^{-1}$ might not be easily found; in this case, the encoder 132 may need to perform a plurality of matrix multiplication operations and/or compensation/adjustment operations to obtain content similar to that of the inverse matrix $K^{-1}$, in order to find the parity-check generation matrix and generate the parity-check code. The present invention therefore provides a circuit mechanism enabling the encoder 132 to complete its operations with minimum hardware cost. It should be noted that, although the coding process in the encoder 132 involves complicated mathematic operations, the details of matrix contents and derivations of those operations are omitted here for brevity since the present invention mainly focuses on the design of the circuit mechanism.

Figure 3:
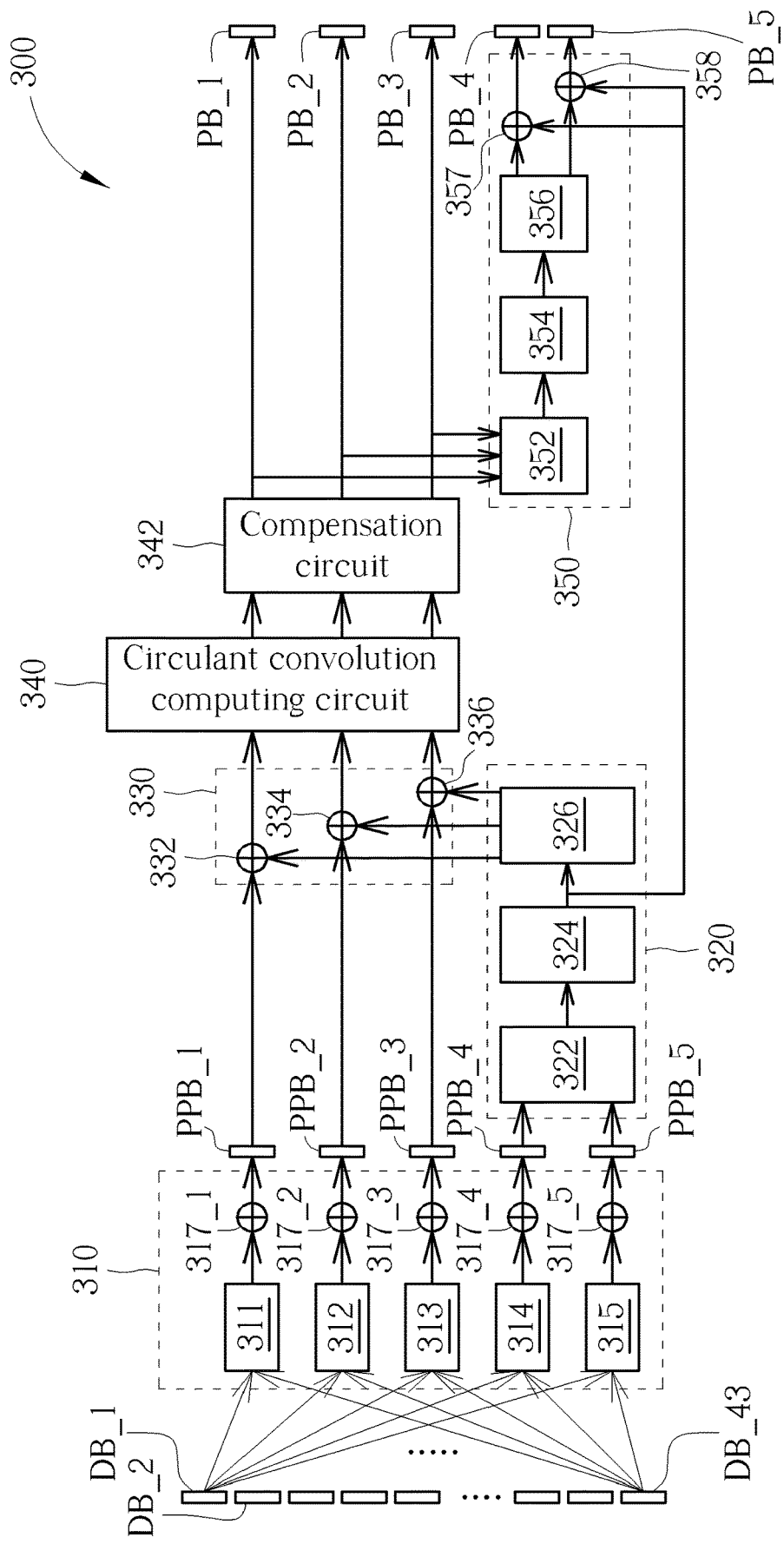
FIG. 3 is a diagram illustrating an encoder according to an embodiment of the present invention.

Refer to FIG. 3, which is a diagram illustrating an encoder 300 according to an embodiment of the present invention, wherein the encoder 300 can be an example of the encoder 132 shown in FIG. 1. As shown in FIG. 3, the encoder 300 comprises a barrel shifter module 310, a first computing circuit 320, an adjusting circuit 330, a circulant convolution computing circuit 340, a compensation circuit 342 and a second computing circuit 350. In this embodiment, the barrel shifter module 310 comprises a plurality of barrel shifters 311, 312, 313, 314 and 315, and a plurality of accumulation circuits 317_1-317_5. The first computing circuit 320 comprises a circulant convolution computing circuit 322, a compensation circuit 324 and a barrel shifter module 326. The adjusting circuit 330 comprises a plurality of accumulation circuits 332, 334 and 336. The second computing circuit 350 comprises a barrel shifter module 352, a circulant convolution computing circuit 354, a compensation circuit 356, and an output circuit which comprises two accumulation circuits 357 and 358. In this embodiment, the encoder 300 divides specific data sent from the host device 130 into a plurality of data blocks (43 data blocks DB_1-DB_43 in total in this embodiment), and encodes the data blocks DB_1-DB_43 to generate a plurality of parity blocks (5 parity blocks PB_1-PB_5 in total in this embodiment). It should be noted that the size of one of said data blocks is the same as that of one of said parity blocks, and the size of the data block can be determined based on design choices. For example, the size can be 192*192 bits.

Regarding operations of the encoder 300, first of all, the barrel shifter module 310 performs operations upon the data blocks DB_1-DB_43 in order to generate a plurality of partial parity blocks PPB_1-PPB_5. More specifically, the barrel shifter 311 may perform shifting operations upon the data blocks DB_1-DB_43, and utilize the accumulation circuit 317_1 to sum the 43 shifted data blocks to obtain the partial parity block PPB_1. The barrel shifter 312 may perform shifting operations upon the data blocks DB_1-DB_43, respectively, and utilize the accumulation circuit 317_2 to sum up the 43 shifted data blocks in order to obtain the partial parity block PPB_2. Similarly, the barrel shifters 313, 314 and 315 may also perform shifting operations upon the data blocks DB_1-DB_43, respectively, and utilize their respective accumulation circuits 317_3, 317_4 and 317_5 to sum the 43 shifted data block to obtain the respective partial parity blocks PPB_3, PPB_4 and PPB_5.

The partial parity blocks PPB_1-PPB_5 may be divided into two portions (e.g. a first portion and a second portion) in order to perform different processes, wherein the first portion comprises three partial parity blocks PPB_1-PPB_3, and the second portion comprises two partial parity blocks PPB_4-PPB_5. In operations of the first computing circuit 320, the circulant convolution computing circuit 322 may perform circulant convolution operations upon the partial parity blocks PPB_4-PPB_5 in order to generate two intermediate blocks. The compensation circuit 324 maybe an optional element, and may be arranged to compensate the two intermediate blocks outputted by the circulant convolution computing circuit 322. The barrel shifter module 326 is arranged to perform operations upon the two intermediate blocks in order to generate three calculating result blocks. In this embodiment, since the barrel shifter module 326 generates three calculating result blocks according to two intermediate blocks, the barrel shifter module 326 may comprise 6 barrel shifters (2*3=6).

The accumulation circuits 332, 334 and 336 in the adjusting circuit 330 may add the three calculating result blocks generated by the barrel shifter module 326 to the partial parity blocks PPB_1-PPB_3, respectively, in order to generate adjusted partial parity blocks.

Next, the circulant convolution computing circuit 340 may perform a circulant convolution operation upon the adjusted first portion partial parity blocks (i.e. PPB_1-PPB_3), and generate parity blocks PB_1-PB_3 via the compensation circuit 342. It should be noted that the compensation circuit 342 is an optional element, which means (depending on circumstances) it might be removed from the encoder 300 with no compensation and influence on the entire operation.

Next, in the operations of the second computing circuit 350, the barrel shifter module 352 may perform operations upon the parity blocks PB_1-PB_3 in order to generate two processed blocks. The circulant convolution computing circuit 354 may perform circulant convolution operations on the two processed blocks in order to generate two output blocks. The compensation circuit 356 is an optional element, and may be arranged to compensate the two output blocks outputted by the circulant convolution computing circuit 354. The accumulation circuits 357 and 357 may add the intermediate block, generated by the circulant convolution computing circuit 322 or the compensation circuit 324, to two output blocks generated by the circulant convolution computing circuit 354 or the compensation circuit 356, in order to generate the parity blocks PB_4-PB_5. In this embodiment, since the barrel shifter module 352 generates two processed blocks according to three parity blocks PB_1-PB_3, the barrel shifter module 352 will comprise 6 barrel shifters (3*2=6).

After generating the parity blocks PB_1-PB_5, the encoder will multiply the data blocks DB_1-DB_43 and the parity blocks PB_1-PB_5 by the parity-check matrix in order to determine whether the parity blocks PB_1-PB_5 are correct or not. If they are correct, the flash memory controller 110 will write the data blocks DB_1-DB_43 and the parity blocks PB_1-PB_5 into a page of a block of the flash memory module 120.

Figure 2:
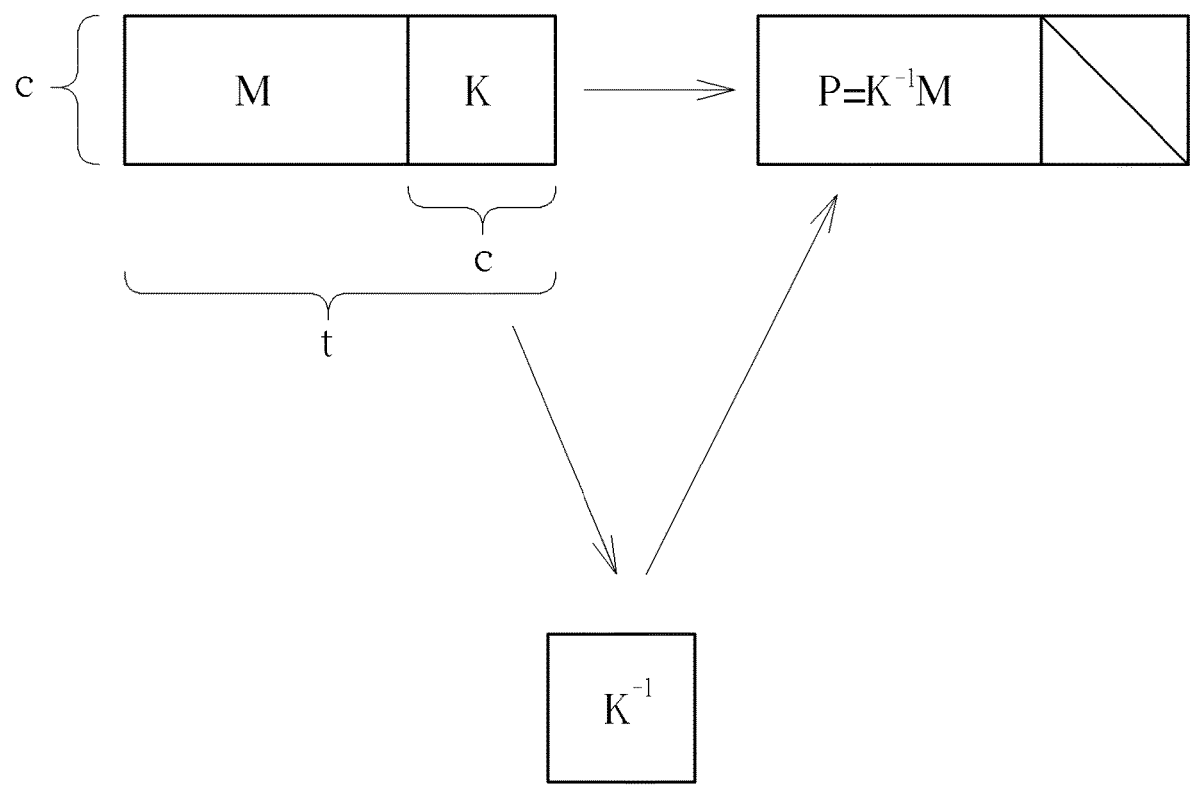
FIG. 2 is a diagram illustrating a parity-check matrix and a parity-check generation matrix.

In the circuitry shown in FIG. 3, the barrel shifter module 310 may be compared with the matrix M shown in FIG. 2. The first computing circuit 320, the adjusting circuit 330, the circulant convolution computing circuit 340, the compensation circuit 342 and the second computing circuit 350 are arranged to generate content similar to that of the inverse matrix $K^{-1}$ shown in FIG. 2, in order to generate the parity blocks PB_1-PB_5 in the situation where the inverse matrix $K^{-1}$ cannot be found. Further, the encoder 300 may comprise three circulant convolution computing circuits 322, 340 and 354, wherein the size of the circulant convolution computing circuit 322 is equal to 2*2 (circulant matrix*block), the size of the circulant convolution computing circuit 340 is equal to 3*3 (circulant matrix*block), and the size of the circulant convolution computing circuit 354 is equal to 2*2 (circulant matrix*block). As a result, the multiplications between circulant matrix and block of the encoder 300 are performed 17 times in total (4+9+4=17). Hence, since the encoder 300 is only required to perform multiplication between the circulant matrix and block 17 times in order to generate 5 parity blocks, the hardware cost of the encoder 300 can be greatly reduced.

Figure 4:
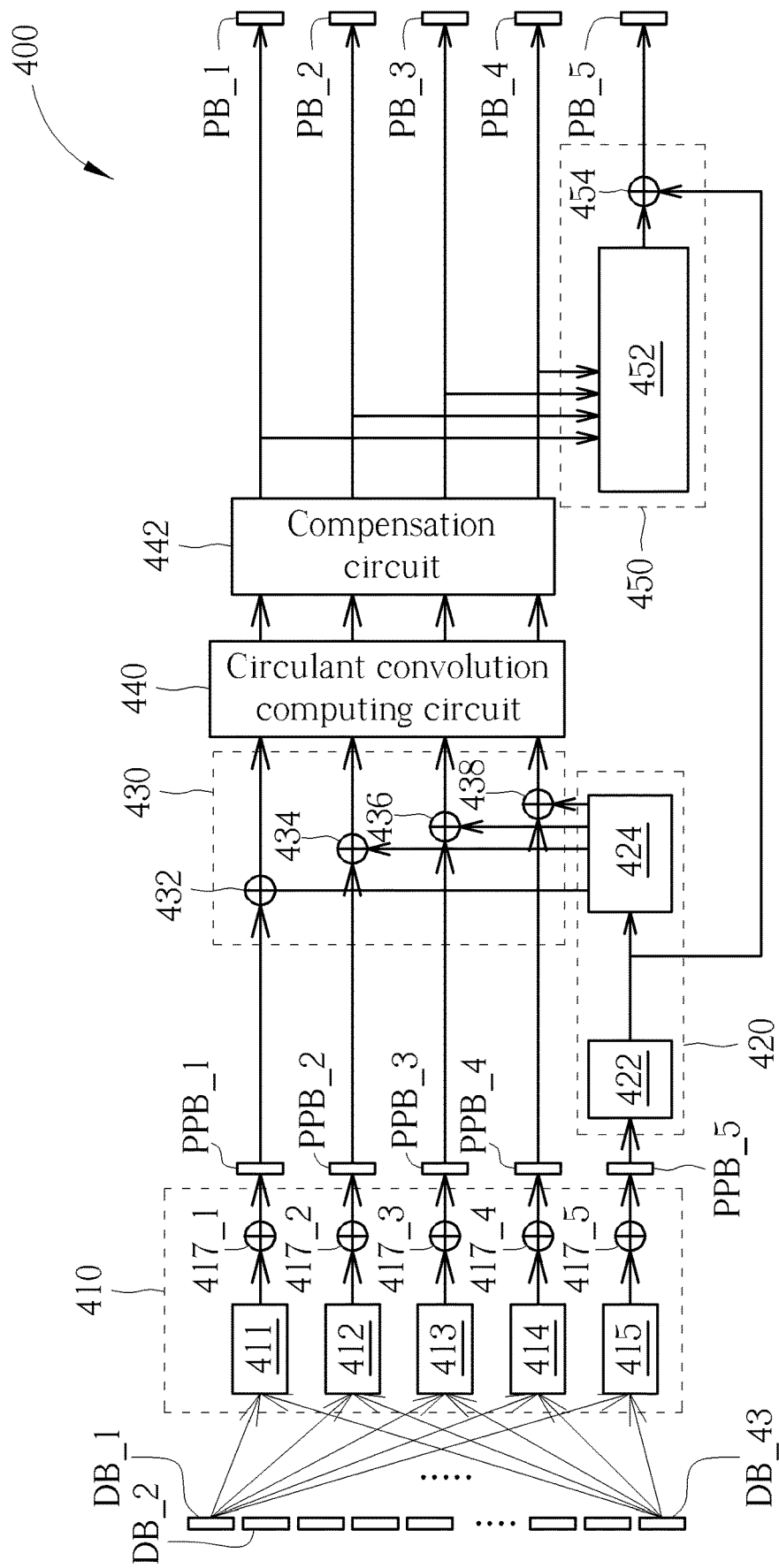
FIG. 4 is a diagram illustrating an encoder according to another embodiment of the present invention.

Refer to FIG. 4, which is a diagram illustrating an encoder 400 according to another embodiment of the present invention, wherein the encoder 400 may be an example of the encoder 132 shown in FIG. 1. As shown in FIG. 4, the encoder 400 comprises a barrel shifter module 410, a first computing circuit 420, an adjusting circuit 430, a circulant convolution computing circuit 440, a compensation circuit 442 and a second computing circuit 450. In this embodiment, the barrel shifter module 410 comprises a plurality of barrel shifters 411, 412, 413, 414 and 415 and a plurality of accumulation circuits 417_1-417_5, wherein the first computing circuit 420 comprises two barrel shifter modules 422 and 424; the adjusting circuit 430 comprises accumulation circuits 432, 434, 436 and 438; and the second computing circuit 350 comprises a barrel shifter module 452 and an output circuit 424. In this embodiment, the encoder 400 divides data from the host device 130 into a plurality of data blocks (e.g. 43 data blocks DB_1-DB_43 in total). Next, the encoder 400 encodes the data blocks DB_1-DB_43 and thereby generates a plurality of parity blocks (5 parity blocks PB_1-PB_5 in total in this embodiment). It should be noted that the size of a data block mentioned above is equal to that of a parity block, and the size of the data block can be adjusted according to the design requirements. For example, the size can be changed to 192*192 bits.

In operations of the encoder 400, initially, the barrel shifter module 410 performs operations upon the data blocks DB_1-DB_43 in order to generate a plurality of partial parity blocks PPB_1-PPB_5. More specifically, the barrel shifter 411 may respectively perform shifting operations upon the data blocks DB_1-DB_43, and accumulate the 43 data blocks via the accumulation circuit 417_1 to obtain the partial parity block PPB_1. The barrel shifter 412 may respectively perform shifting operations upon the data blocks DB_1-DB_43, and may accumulate the 43 data blocks via the accumulation circuit 417_2 to obtain the partial parity block PPB_2. Similarly, the barrel shifters 413, 414 and 415 may respectively perform shifting operations upon the data blocks DB_1-DB_43, and accumulate the 43 data blocks via the accumulation circuits 417_3, 417_4 and 417_5 to obtain their respective partial parity blocks PPB_3, PPB_4 and PPB_5.

The partial parity blocks PPB_1-PPB_5 will later be divided into two portions for different processes, wherein the first portion comprises four partial parity blocks PPB_1-PPB_4, and the second portion comprises one partial parity block PPB_5. In the operations of the first computing circuit 420, the barrel shifter module 422 performs shifting operations upon the partial parity block PPB_5 in order to generate an intermediate block, and barrel shifter module 424 performs operations upon the intermediate block in order to generate four calculating result blocks.

The accumulation circuits 432, 434, 436 and 438 in the adjusting circuit 430 add the four calculating result blocks generated by the barrel shifter module 424 to the partial parity blocks PPB_1-PPB_4, respectively, in order to generate adjusted partial parity blocks.

The circulant convolution computing circuit 440 then performs circulant convolution operations upon the partial parity blocks of the adjusted first portion (i.e. PPB_1-PPB_4), and generates the parity blocks PB_1-PB_4 via the compensation circuit 442. It should be noted that the compensation circuit 442 maybe a removable element. That is, when there is no need for compensation, it can be removed from the encoder 400 without affecting the entire procedure.

Next, in the operations of the second computing circuit 450, the barrel shifter module 452 may perform operations upon the parity blocks PB_1-PB_4 in order to generate a processed block. The output circuit 454 may add the intermediate block generated by the barrel shifter module 422 to the output block generated by the barrel shifter module 452, in order to generate the parity block PB_5.

After the parity blocks PB_1-PB_5 are generated, the encoder will multiply the data blocks DB_1-DB_43 and the parity blocks PB_1-PB_5 with the parity-check matrix, in order to determine whether the parity blocks PB_1-PB_5 are correct or not. If they are correct, the flash memory controller 110 will write the data blocks DB_1-DB_43 and the parity blocks PB_1-PB_5 into a page of a block of the flash memory module 120.

In the circuitry shown in FIG. 4, the barrel shifter module 410 may be compared with the matrix M shown in FIG. 2, and the first computing circuit 420, the adjusting circuit 430, the circulant convolution computing circuit 440, the compensation circuit 442 and the second computing circuit 450 are arranged to generate content similar to the inverse matrix $K^{-1}$ shown in FIG. 2, in order to generate the parity blocks PB_1-PB_5 even when the inverse matrix $K^{-1}$ cannot be found. Further, the encoder 400 comprises only one circulant convolution computing circuit 440, wherein the size of the circulant convolution computing circuit 440 is 4*4 (circulant matrix*block). Hence, since the encoder 400 is only required to perform multiplications 16 times to generate 5 parity blocks, the hardware cost of the encoder 400 can be greatly reduced.

If the matrix Kin the parity-check matrix is of a certain type, e.g. the values in the last column and the last row are all "0", the elements of the encoder 400 shown in FIG. 4 may be further reduced. This can be demonstrated by referring to the following embodiment shown in FIG. 5.

Figure 5:
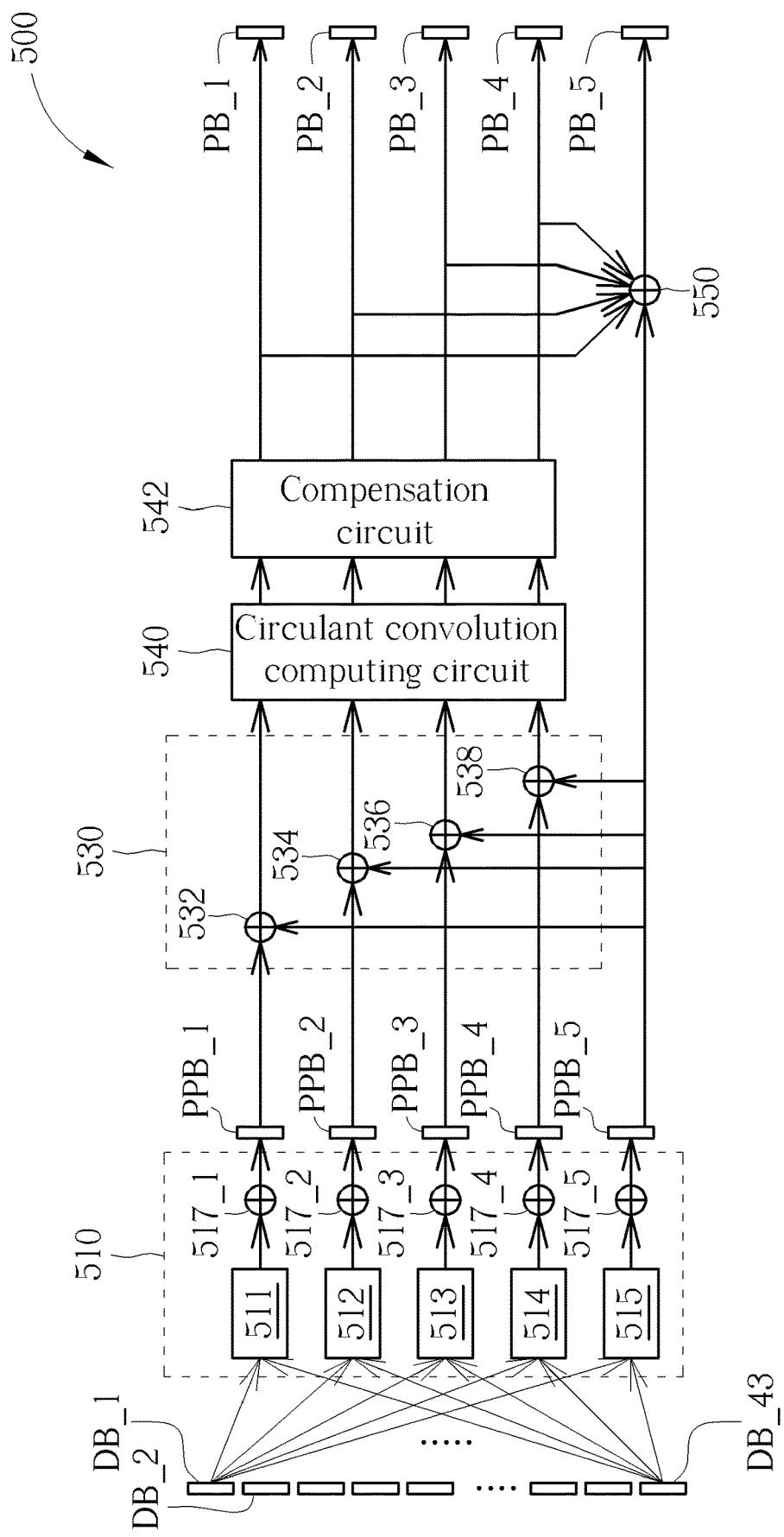
FIG. 5 is a diagram illustrating an encoder according to another embodiment of the present invention.

FIG. 5 is a diagram illustrating an encoder 500 according to another embodiment of the present invention, wherein the encoder 500 may be an example of the encoder 132 shown in FIG. 1. As shown in FIG. 5, the encoder 500 comprises a barrel shifter module 510, an adjusting circuit 530, a circulant convolution computing circuit 540, a compensation circuit 542 and a computing circuit 550. In this embodiment, the barrel shifter module 510 comprises a plurality of barrel shifters 511, 512, 513, 514 and 515 and a plurality of accumulation circuits 517_1-517_5. In this embodiment, the encoder 500 divides the data from the host device 130 into a plurality of data blocks (43 data blocks DB_1-DB_43 in total in this embodiment). Further, the encoder 500 encodes the data blocks DB_1-DB_43 and thereby generates a plurality of parity blocks (5 parity blocks PB_1-PB_5 in total in this embodiment). It should be noted that the size of one data block is the same as that of one parity block. The size of data blocks can be set based on user requirements, e.g. 192*192 bits.

In operations of the encoder 500, initially, the barrel shifter module 510 may perform operations upon the data blocks DB_1-DB_43 in order to generate a plurality of partial parity blocks PPB_1-PPB_5. More specifically, the barrel shifter 511 may perform shifting operations upon the data blocks DB_1-DB_43, respectively, and may accumulate the 43 data blocks via the accumulation circuit 517_1 to obtain the partial parity block PPB_1. Further, the barrel shifter 512 may respectively perform shifting operations upon the data blocks DB_1-DB_43, and may accumulate the 43 data blocks via the accumulation circuit 517_2 to obtain the partial parity block PPB_2. Similarly, the barrel shifters 513, 514 and 515 may perform shifting operations upon the data blocks DB_1-DB_43, respectively, and may accumulate the 43 data blocks via the accumulation circuits 517_3, 517_4 and 517_5 to obtain the partial parity blocks PPB_3, PPB_4 and PPB_5.

The partial parity blocks PPB_1-PPB_5 will be divided into two portions for difference processes, wherein the first portion comprises four partial parity blocks PPB_1-PPB_4, and the second portion comprises a partial parity block PPB_5. The accumulation circuits 532, 534, 536 and 538 in the adjusting circuit 530 may add the content of the partial parity block PPB_5 into the partial parity blocks PPB_1-PPB_4, respectively, in order to generate adjusted partial parity blocks.

Next, the circulant convolution computing circuit 540 performs circulant convolution operations upon the adjusted first portion of partial parity blocks (i.e. PPB_1-PPB_4), and generates the parity blocks PB_1-PB_4 via the compensation circuit 542. It should be noted that the compensation circuit 542 may be a removable element, which means when there is no need for compensation, it can be removed from the encoder 500 without affecting the entire procedure.

Then, the computing circuit 550 adds the partial parity block PPB_5 to the parity blocks PB_1-PB_4, respectively, in order to generate the parity block PB_5.

After the parity blocks PB_1-PB_5 are generated, the encoder will multiple the data blocks DB_1-DB_43 and the parity blocks PB_1-PB_5 with the parity-check matrix in order to determine whether the parity blocks PB_1-PB_5 are correct or not. If they are correct, the flash memory controller 110 will write the data blocks DB_1-DB_43 and the parity blocks PB_1-PB_5 into a page of a block of the flash memory module 120.

In the circuitry shown in FIG. 5, the barrel shifter module 510 may be compared with the matrix M shown in FIG. 2, and the adjusting circuit 530, the circulant convolution computing circuit 540, the compensation circuit 542 and the computing circuit 550 are arranged to generate content similar to the inverse matrix $K^{-1}$ shown in FIG. 2, in order to be able to generate the parity blocks PB_1-PB_5 even when the inverse matrix $K^{-1}$ cannot be found. Further, the encoder 500 comprises only one circulant convolution computing circuit 540, wherein the size of the circulant convolution computing circuit 540 is 4*4 (circulant matrix*block). Hence, since the encoder 500 is only required to perform multiplication (circulant matrix*block) 16 times to generate 5 parity blocks, the hardware cost of the encoder 500 can be greatly reduced. Compared with the embodiment shown in FIG. 4, this embodiment further omits a portion of elements in the first computing circuit 420 and the second computing circuit 450, thus reducing the overall cost.

Figure 6:
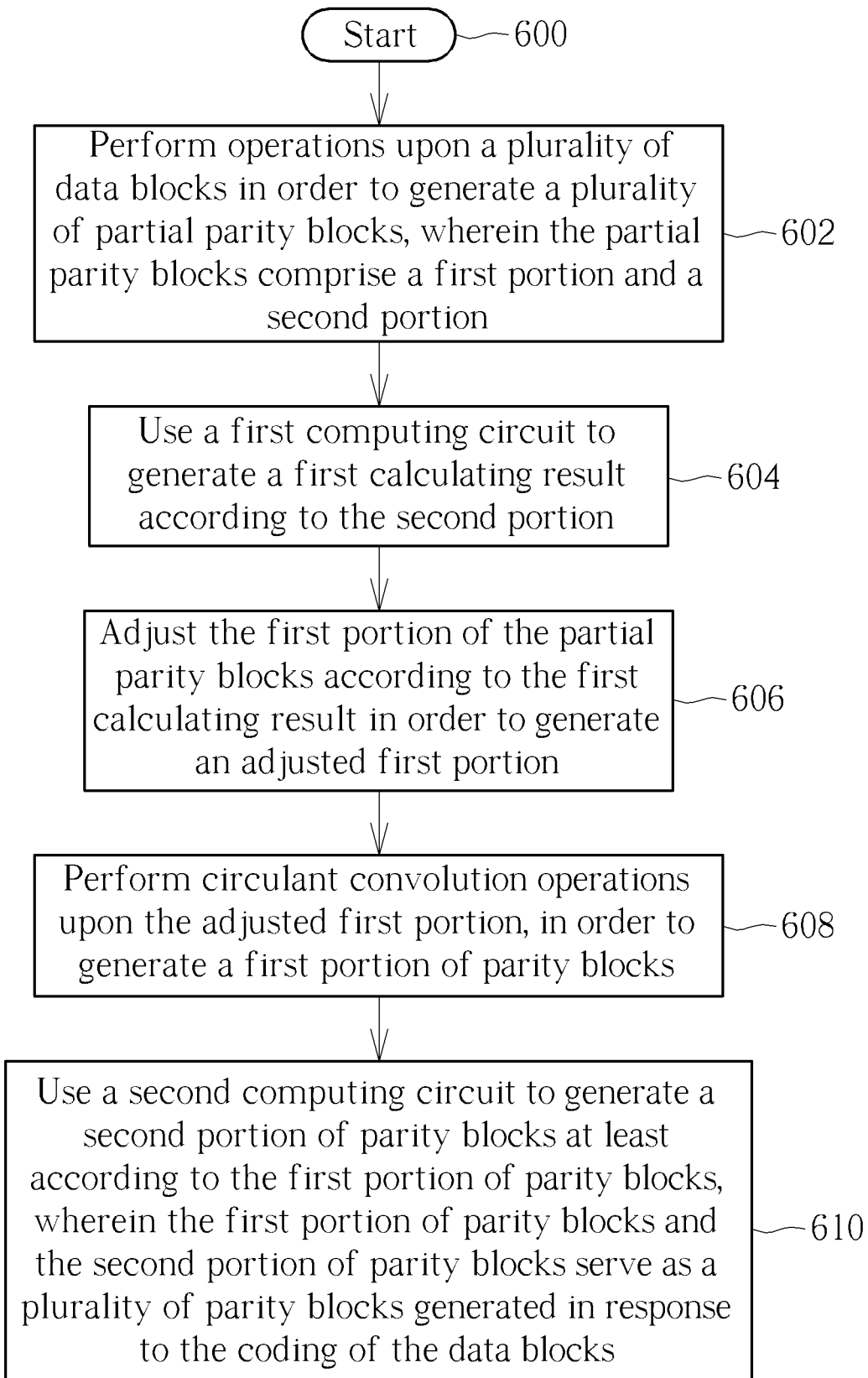
FIG. 6 is a flowchart illustrating an encoding method according to an embodiment of the present invention.

Refer to FIG. 6, which is a flowchart illustrating an encoding method according to an embodiment of the present invention. The detailed steps are described as follows, wherein the contents disclosed in the above embodiments and figures can be jointly referenced.

Step 600: Start.

Step 602: Perform operations upon a plurality of data blocks in order to generate a plurality of partial parity blocks, wherein the partial parity blocks comprise a first portion and a second portion.

Step 604: Use a first computing circuit to generate a first calculating result according to the second portion.

Step 606: Adjust the first portion of the partial parity blocks according to the first calculating result in order to generate an adjusted first portion.

Step 608: Perform circulant convolution operations upon the adjusted first portion, in order to generate a first portion of parity blocks.

Step 610: Use a second computing circuit to generate a second portion of parity blocks at least according to the first portion of parity blocks, wherein the first portion of parity blocks and the second portion of parity blocks serve as a plurality of parity blocks generated in response to the coding of the data blocks.

To summarize, the encoder of the present invention divides the partial parity blocks into two portions to perform different operations, in order to reduce hardware requirements for circulant convolution calculations in the encoder when parity blocks can be actually generated. Hence, the encoder of the present invention may prevent the problem encountered in related art techniques, i.e. preventing hardware costs from being greatly increased.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. An encoder installed in a flash memory controller, comprising:
   a first barrel shifter module, arranged to process a plurality of data blocks in order to generate a plurality of partial parity blocks, wherein the partial parity blocks comprise a first portion and a second portion;
   a first computing circuit, coupled to the first barrel shifter module, the first computing circuit arranged to generate a first calculating result according to the second portion;
   an adjusting circuit, arranged to adjust the first portion according to the first calculating result, in order to generate an adjusted first portion;
   a first circulant convolution computing circuit, coupled to the adjusting circuit, the first circulant convolution arranged to perform circulant convolution operations upon the adjusted first portion, in order to generate a first portion of parity blocks; and
   a second computing circuit, coupled to the first circulant convolution computing circuit, the second computing circuit arranged to generate a second portion of parity blocks at least according to the first portion of parity blocks;
   wherein the first portion of parity blocks and the second portion of parity blocks serve as a plurality of parity blocks generated for the data blocks by the encoder, and the data blocks and the parity blocks are written into a flash memory.

2. The encoder of claim 1, wherein the second portion comprises at least two partial parity blocks, and each of the first computing circuit and the second computing circuit comprises a circulant convolution operation.

3. The encoder of claim 2, wherein the first portion comprises C1 partial parity blocks, the second portion comprises C2 partial parity blocks, and the first computing circuit comprises:
   a second circulant convolution computing circuit, arranged to perform circulant convolution operations upon C2 partial parity blocks, in order to generate C2 intermediate blocks; and
   a second barrel shifter module, coupled to the second circulant convolution computing circuit, the second barrel shifter module arranged to perform operations upon the C2 intermediate blocks in order to generate C1 calculating result blocks as the first calculating result;
   wherein the adjusting circuit adds the C1 calculating result blocks to the C1 partial parity blocks, respectively, in order to generate the adjusted first portion.

4. The encoder of claim 3, wherein the first portion of parity blocks comprises C1 parity blocks, and the second computing circuit comprises:
   a third barrel shifter module, arranged to perform operations upon the C1 parity blocks in order to generate C2 processed blocks;
   a third circulant convolution computing circuit, coupled to the third barrel shifter module, the third circulant convolution computing circuit arranged to perform circulant convolution operations upon the C2 processed blocks in order to generate C2 output blocks; and
   an output circuit, coupled to the third circulant convolution computing circuit, the output circuit arranged to adjust the C2 output blocks according to the C2 intermediate blocks in order to generate C2 parity blocks as the second portion of parity blocks.

5. The encoder of claim 1, wherein neither of the first computing circuit and the second computing circuit comprises any circulant convolution operation.

6. The encoder of claim 5, wherein the first portion comprises C1 partial parity blocks, the second portion comprises C2 partial parity blocks, C2 is equal to 1, and the first computing circuit comprises:
a second barrel shifter module, arranged to perform operations upon the C2 partial parity blocks in order to generate C1 calculating result blocks as the first calculating result;
wherein the adjusting circuit adds the C1 calculating result blocks to the C1 partial parity blocks, respectively, in order to generate the adjusted first portion.

7. The encoder of claim 6, wherein the first portion of parity blocks comprises C1 parity blocks, and the second computing circuit comprises:
a third barrel shifter module, arranged to perform operations upon the C1 parity blocks to generate C2 processed blocks;
an output circuit, coupled to the third barrel shifter module, the output circuit arranged to adjust the C2 output blocks according to the C2 intermediate blocks, in order to generate C2 parity blocks as the second portion of parity blocks.

8. The encoder of claim 1, being a low-density parity check (LDPC) code encoding circuit in the flash memory controller.

9. A flash memory controller, arranged to access a flash memory module and comprising:
a memory, arranged to store a code;
a microprocessor, arranged to execute the code in order to control access of the flash memory module; and
an encoder, arranged to encode the data blocks in order to obtain a plurality of parity blocks, wherein the encoder comprises:
a first barrel shifter module, arranged to perform operations upon a plurality of data blocks in order to generate a plurality of partial parity blocks, wherein the partial parity blocks comprise a first portion and a second portion;
a first computing circuit, coupled to the first barrel shifter module, arranged to generate a first calculating result according to the second portion;
an adjusting circuit, arranged to adjust the first portion of the partial parity blocks according to the first calculating result, in order to generate an adjusted first portion;
a first circulant convolution computing circuit, coupled to the adjusting circuit, and arranged to perform circulant convolution operations upon the adjusted first portion, in order to generate a first portion of parity blocks; and
a second computing circuit, coupled to the first circulant convolution computing circuit, the second computing circuit arranged to generate a second portion of parity blocks at least according to the first portion of parity blocks;
wherein the first portion of parity blocks and the second portion of parity blocks serve as a plurality of parity blocks generated for the data blocks by the encoder.

10. The flash memory controller according to claim 9, wherein the second portion comprises at least two partial parity blocks, and each of the first computing circuit and the second computing circuit comprises a circulant convolution operation.

11. The flash memory controller according to claim 10, wherein the first portion comprises C1 partial parity blocks, the second portion comprises C2 partial parity blocks, and the first computing circuit comprises:
a second circulant convolution computing circuit, arranged to perform circulant convolution operations upon C2 partial parity blocks in order to generate C2 intermediate blocks; and
a second barrel shifter module, coupled to the second circulant convolution computing circuit, the second barrel shifter module arranged to perform operations upon the C2 intermediate blocks in order to generate C1 calculating result blocks as the first calculating result;
wherein the adjusting circuit adds the C1 calculating result blocks to the C1 partial parity blocks, respectively, in order to generate the adjusted first portion.

12. The flash memory controller according to claim 11, wherein the first portion of parity blocks comprises C1 parity blocks, and the second computing circuit comprises:
a third barrel shifter module, arranged to perform operations upon the C1 parity blocks in order to generate C2 processed blocks;
a third circulant convolution computing circuit, coupled to the third barrel shifter module, the third circulant convolution arranged to perform circulant convolution operations upon C2 processed blocks in order to generate C2 output blocks;
an output circuit, coupled to the third circulant convolution computing circuit, and arranged to adjust the C2 output blocks according to the C2 intermediate blocks, in order to generate C2 parity blocks as the second portion of parity blocks.

13. The flash memory controller according to claim 9, wherein neither of the first computing circuit and the second computing circuit comprises any circulant convolution operation.

14. The flash memory controller according to claim 13, wherein the first portion comprises C1 partial parity blocks, the second portion comprises C2 partial parity blocks, C2 is equal to 1, and the first computing circuit comprises:
a second barrel shifter module, arranged to perform operations upon the C2 partial parity blocks in order to generate C1 calculating result blocks as the first calculating result;
wherein the adjusting circuit adds the C1 calculating result blocks to the C1 partial parity blocks perform, respectively, in order to generate the adjusted first portion.

15. The flash memory controller according to claim 14, wherein the first portion of parity blocks comprises C1 parity blocks, and the second computing circuit comprises:
a third barrel shifter module, arranged to perform operations upon the C1 parity blocks in order to generate C2 processed blocks;
an output circuit, coupled to the third barrel shifter module, the output circuit arranged to adjust the C2 output blocks according to the C2 intermediate blocks, in order to generate C2 parity blocks as the second portion of parity blocks.

16. The flash memory controller according to claim 9, which functions as a low-density parity check (LDPC) code encoder.

17. An encoding method for a flash memory controller, comprising:

processing a plurality of data blocks to generate a plurality of partial parity blocks, wherein the partial parity blocks comprise a first portion and a second portion;

using a first computing circuit to generate a first calculating result according to the second portion;

adjusting the first portion of the partial parity blocks according to the first calculating result, in order to generate an adjusted first portion;

performing circulant convolution operations upon the adjusted first portion, in order to generate a first portion of parity blocks; and using a second computing circuit to generate a second portion of the parity blocks according to at least the first portion of parity blocks;

wherein the first portion of the parity blocks and the second portion of the parity blocks serve as a plurality of parity blocks generated by encoding the data blocks, and the data blocks and the parity blocks are written into a flash memory.

18. The encoding method of claim 17, wherein the second portion comprises at least two partial parity blocks, and each of the first computing circuit and the second computing circuit comprises a circulant convolution operation.

19. The encoding method of claim 17, wherein neither of the first computing circuit and the second computing circuit comprises any circulant convolution operation.

20. The encoding method of claim 17, wherein the flash memory controller functions as a low-density parity check (LDPC) code encoder.

21. An encoder installed in a flash memory controller, comprising:

a barrel shifter module, arranged to perform operations upon a plurality of data blocks in order to generate a plurality of partial parity blocks, wherein the partial parity blocks comprise a first portion and a second portion;

an adjusting circuit, arranged to adjust the first portion of the partial parity blocks according to the second portion, in order to generate an adjusted first portion;

a circulant convolution computing circuit, coupled to the adjusting circuit, and arranged to perform circulant convolution operations on the adjusted first portion in order to generate a first portion of parity blocks; and a computing circuit, coupled to the circulant convolution computing circuit, the computing circuit arranged to generate a second portion of parity blocks at least according to the first portion of parity blocks;

wherein the first portion of parity blocks and the second portion of parity blocks serve as a plurality of parity blocks generated for the data blocks by the encoder, and the data blocks and the parity blocks are written into a flash memory.

* * * * *